United States Patent
Gabrys et al.

(10) Patent No.: US 11,342,937 B2
(45) Date of Patent: May 24, 2022

(54) ADAPTIVE CROSS-LAYER ERROR CONTROL CODING FOR HETEROGENEOUS APPLICATION ENVIRONMENTS

(71) Applicant: The United States of America as Represented by the Secretary of the Navy, San Diego, CA (US)

(72) Inventors: Ryan Christopher Gabrys, San Diego, CA (US); Jayson T. Durham, San Diego, CA (US)

(73) Assignee: United States of America as represented by the Secretary of the Navy, Washington, DC (US)

(*) Notice: Subject to any disclaimer, the term of this patent is extended or adjusted under 35 U.S.C. 154(b) by 246 days.

(21) Appl. No.: 16/788,051

(22) Filed: Feb. 11, 2020

(65) Prior Publication Data
US 2021/0250049 A1 Aug. 12, 2021

(51) Int. Cl.
*H03M 13/00* (2006.01)
*H03M 13/15* (2006.01)
*H04L 1/00* (2006.01)
*G06N 20/00* (2019.01)
*H04L 25/02* (2006.01)
*H04L 43/12* (2022.01)

(52) U.S. Cl.
CPC ........ *H03M 13/1515* (2013.01); *G06N 20/00* (2019.01); *H04L 1/0061* (2013.01); *H04L 25/024* (2013.01); *H04L 43/12* (2013.01)

(58) Field of Classification Search
CPC .......... H03M 13/1515; H03M 13/353; H03M 13/373; H03M 13/3761; G06N 20/00; H04L 1/0061; H04L 25/024; H04L 43/12; H04L 1/0009; H04L 1/0041; H04L 1/0057; H04L 41/0816; H04L 41/16
USPC .................................. 714/752, 799
See application file for complete search history.

(56) References Cited

U.S. PATENT DOCUMENTS

| | | | |
|---|---|---|---|
| 7,966,537 B2 | 7/2011 | Bonaccio et al. | |
| 10,303,881 B2 | 5/2019 | Mitola, III | |
| 2005/0251725 A1* | 11/2005 | Huang | H03M 13/2789 714/752 |
| 2006/0268933 A1* | 11/2006 | Kellerer | H04L 67/14 370/469 |

(Continued)

OTHER PUBLICATIONS

Gabrys et al,. "Constructions of Partial MDS Codes over Small Fields," IEEE International Symposium on Information Theory (ISIT) (2017), 5 pages.

(Continued)

*Primary Examiner* — Albert Decady
*Assistant Examiner* — Osman M Alshack
(74) *Attorney, Agent, or Firm* — Naval Information Warfare Center, Pacific; Kyle Eppele; James R. McGee (57) ABSTRACT

At a physical data-link in a network, a current status of a plurality of logical data-channels in the network is determined, using machine learning to infer the current status. A plurality of cross-layer error correction coding schemes for transmissions is adaptively adjusted, based on the determined current status, and based on an application transmitting data. Transmission of the data, and a plurality of information-exchange requirements, are supported, using the adaptively adjusted plurality of error correction coding schemes.

17 Claims, 4 Drawing Sheets

(56) References Cited

U.S. PATENT DOCUMENTS

| | | | | |
|---|---|---|---|---|
| 2009/0122700 | A1* | 5/2009 | Aboba | H04W 28/20 370/230 |
| 2009/0199064 | A1* | 8/2009 | Radha | H04L 1/0072 714/752 |
| 2009/0219990 | A1* | 9/2009 | Han | H04N 19/154 375/240.02 |
| 2010/0226262 | A1* | 9/2010 | Liu | H04N 21/44209 370/252 |
| 2012/0307934 | A1* | 12/2012 | Heidari | H04L 1/0003 375/295 |
| 2015/0249835 | A1* | 9/2015 | Yie | H04N 19/895 375/240.02 |
| 2017/0222754 | A1* | 8/2017 | Noh | H04L 1/0061 |
| 2018/0091819 | A1* | 3/2018 | Cook | H04N 19/67 |
| 2019/0173933 | A1 | 6/2019 | Totzke et al. | |
| 2021/0119848 | A1* | 4/2021 | Ibars Casas | H03M 13/1105 |

OTHER PUBLICATIONS

Perkins, R., F. et al., "C2 Data Synchronization in Disconnected, Intermittent, and Low-bandwidth (DIL) Environments," ICCRTS, 2013, 19 pages.

Durham, J., R. et al., "Network-Centric Operations Support: Lessons Learned, Status, and Way-Ahead," 19th ICCRTS, 2014, 20 pages.

Durham, J., R. et al., "An Experimentation -ramework for Federated Data-Sharing Services Operating in Denied—Disconnected/Disrupted, Intermittent, and Limited-bandwidth (D-DIL) Environments," 20th ICCRTS, 2015, 52 pages.

Durham, J., R. et al., "An Experimentation Framework for Developing Resilient Cross-Layer Communications Services," 21st ICCRTS, 2016, 42 pages.

Durham, J., R. et al., "Link-Autonomy and Autonomies for Developing Cross-Layer Communications Services," 22nd ICCRTS, 2017.

Lopes, Y., et al., "ARES: An Autonomic and Resilient Framework for Smart Grids," IFIP/IEEE International Symposium on Integrated Network Management (IM2017), pp. 222-229.

Vuran, et al., "Cross-Layer Analysis of Error Control in Wireless-Sensor Networks," IEEE SECON 2006, 10 pages.

Anker, T., et al., "Transport Layer End-to-End Error Correcting," The School of Computer Science and Engineering. Hebrew University (2004), 9 pages.

Subramanian, et al., "An End-to-End Transport Protocol for Extreme Wireless Network Environments," Military Communications Conference, Washington DC, IEEE (2006), 7 pages.

P. Gopalan, P., et al., "Explicit Maximally Recoverable Codes with Locality," https://arxiv.org/pdf/1307.4150.pdf, (2013), 14 pages.

Choi, J-Y, et al., "Cross-layer error-control with low-overhead ARQ for H.264 video transmission over wireless LANs," Journal of Computer Communications, vol. 30 Issue 7, May 2007, pp. 1476-1486.

* cited by examiner

ADAPTIVE CROSS-LAYER ERROR CONTROL CODING FOR HETEROGENEOUS APPLICATION ENVIRONMENTS

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 72120, San Diego, Calif., 92152; telephone (619)553-5118; email: ssc_pac_t2@navy.mil. Reference Navy Case No. 104,783.

BACKGROUND

Much work has been done to minimize errors in transmissions in communications networks. For example, there has been some work regarding the use of cross-layer adaptive error control coding. In particular, Anker (see, e.g., T. Anker, R. C., "Transport Layer End-to-End Error Correcting," The School of Computer Science and Engineering, Hebrew University (2004)) considered the use of maximum distance separable (MDS) codes at the application layer to overcome many of the issues with the Transmission Control Protocol (TCP), and V. Subramanian et al. (see, e.g., V. Subramanian, S. K., "An End-to-end transport protocol for extreme wireless network environments," Military Communications Conference. Washington D.C.: IEEE, (2006)) investigated the use of adaptive coding schemes to deal with disruptive wireless environments. Other works have investigated cross-layer strategies that deal specifically with wireless sensor networks and video transmission such as in Choi et al. (see, e.g., Jeong-Yong Choi, J. S., "Cross-layer error-control with low-overhead ARQ for H.264 video transmission over wireless LANs," Journal of Computer Communications, 1476-1486 (2007)) and Vuran et. al. (see, e.g., M. C. Vuran, I. F. (2006), "Cross-layer analysis of error control in wireless sensor networks," International Conference on Sensing, Communication, and Networking, Reston, Va.: IEEE (2006)).

Additionally, much work has been done to provide autonomic (i.e., self-adaptive) computing systems. In such systems, computers monitor themselves and adapt their performance, to provide self-healing, self-adaptive infrastructures, which can diminish a need for human intervention in situations of suboptimal performance.

In particular, for supporting distributed network-centric operations, there is an ongoing need for developing reliable, robust, and resilient tactical Intelligence, Surveillance, and Reconnaissance (ISR) communications and networking support capabilities that can be trusted to operate within a variety of adverse conditions. The utilization of autonomic computing frameworks (e.g. RAINBOW) provide standardized methods/techniques and associated computational resources for developing and assessing a variety of strategies (i.e. probes, effectors, decision logic) that enable wireless line-of-sight (LOS) data-links to adapt to adverse conditions that may impact the ability to meet information exchange requirements for respective net-centric distributed operations.

Within the context of autonomic computing technologies and respective adaptation strategies, Durham et al. (see, e.g., Durham, J., R. et al., "An Experimentation Framework for Developing Resilient Cross-Layer Communications Services," 21st ICCRTS, 2016) highlights the ability to concurrently address the need for extending and augmenting such adaptation services to include model-based integration of emerging standardized architectures/frameworks, open source resources, and their respective source-level build capabilities. For example, such work focuses on how a growing assortment of commercial-off-the-shelf and government-off-the shelf (COTS/GOTS) resources, which includes the RAINBOW framework, can support self-adaptive cross-layer cross-platform content delivery/distribution networking (CDN) and respective endpoint-management requirements within the context of emerging data-modeling and enterprise-computing standards.

Clearly there is a need for improved mission-driven information transmission and respective information-exchange performance transmissions in communications networks, wherein self-adaptive devices inherently support such capabilities.

SUMMARY

At a physical data-link in a network, a current status of a plurality of logical data-channels in the network is determined, using machine learning to infer the current status. A plurality of cross-layer error correction coding schemes for transmissions is adaptively adjusted, based on the determined current status, and based on an application transmitting data. Transmission of the data, and a plurality of information-exchange requirements, are supported, using the adaptively adjusted plurality of error correction coding schemes.

A system includes a transmitter in a network, the transmitter including at least one hardware device processor and a non-transitory computer-readable storage medium storing instructions that are executable by the at least one hardware device processor to determine a current status of a plurality of channels in the network, using machine learning to infer the current status; adaptively adjust a plurality of cross-layer error correction coding schemes for transmissions, based on the determined current status, and based on an application transmitting data; and initiate transmission of the data, using the adaptively adjusted plurality of error correction coding schemes.

This Summary is provided to introduce a selection of concepts that are further described below in the Detailed Description. This Summary is not intended to identify key features or essential features of the claimed subject matter, nor is it intended to be used to limit the scope of the claimed subject matter. The details of one or more implementations are set forth in the accompanying drawings and the description below. Other features will be apparent from the description and drawings, and from the claims.

DETAILED DESCRIPTION

In an example embodiment, a physical data-link in a network may determine a current status of logical data-channels in the network, using machine learning to infer the current status. The physical data-link adaptively adjusts a plurality of cross-layer error correction coding schemes for transmissions, based on the determined current status, and based on an application transmitting data. The physical data-link initiates transmission of the data, using the adaptively adjusted plurality of error correction coding schemes.

For example, the physical data-link may use probes to sense network conditions. Further, the transmitter may include an autonomic (i.e., self-adaptive) device that includes machine learning logic to infer the current status of the network.

Example techniques discussed herein may provide an adaptive communications framework for a radio system. For example, such techniques may enable robust communications capabilities within degraded communications networks. In some embodiments, techniques discussed herein may be embodied in autonomic systems, and may employ distributed forward error correction (FEC) techniques to provide improved optimal support of logical data flows.

In some embodiments, example techniques discussed herein apply adaptive transmission schemes that tailor the parameters of coding schemes at the packet layer to a specific suite of applications. As discussed further below, machine learning techniques may be used to infer the conditions of the underlying logical data-channels, and this information is used to adapt the coding techniques. The coding schemes are adapted based on the applications transmitting/receiving data as well as the logical data-channel through which the data is exchanged. The coding schemes may be built upon a class of MDS codes founded by Gopalan (see, e.g., P. Gopalan, C. H., "Explicit maximally recoverable codes with locality," *IEEE Transactions on Information Theory*, pp. 5245-5256, (2014)) and currently used in the context of distributed storage.

The example schemes discussed herein may advantageously take into account the needs of the individual applications exchanging information. Given this knowledge, the error-control codes may have greater flexibility to adjust their parameters to meet the needs of the applications. In some embodiments, at the application (APP) layer, the schemes may ensure that Quality of Service (QoS) requirements are met. For example, at the APP layer, packet errors are managed. In addition, the underlying MDS codes may advantageously average out periods of high and low signal-to-noise ratio (SNR), which may be common in some networks, such as tactical networks. In some embodiments, at the physical (PHY) layer, the schemes may manage errors at the bit level.

Figure 1:
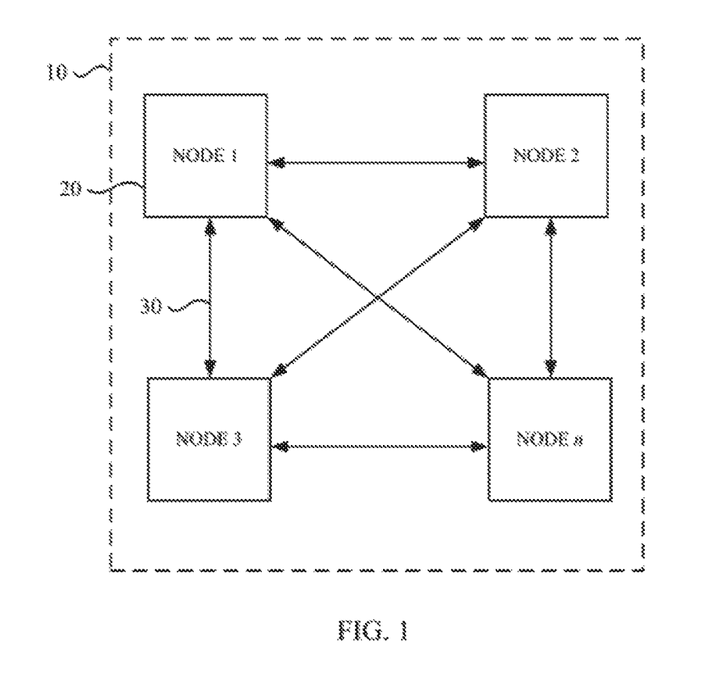
FIG. 1 is a block diagram of an example system having a distributed network architecture.

FIG. 1 is a block diagram of an example system 10 having a distributed network architecture that may be used to implement techniques discussed herein. System 10 may include a plurality of nodes 20 that are each configured to send signals 30 to each of the other nodes 20 and receive signals 30 from each of the other nodes 20. Nodes 20 may be organized in any type of distributed network configuration. In some embodiments, nodes 20 are fixed in their location within the network. In some embodiments, nodes 20 are mobile and are able to move about within the network. In some embodiments, system 10 may include both fixed and mobile nodes. In some embodiments, nodes 20 comprise sensors that may be used to detect objects within an environment.

Figure 2:
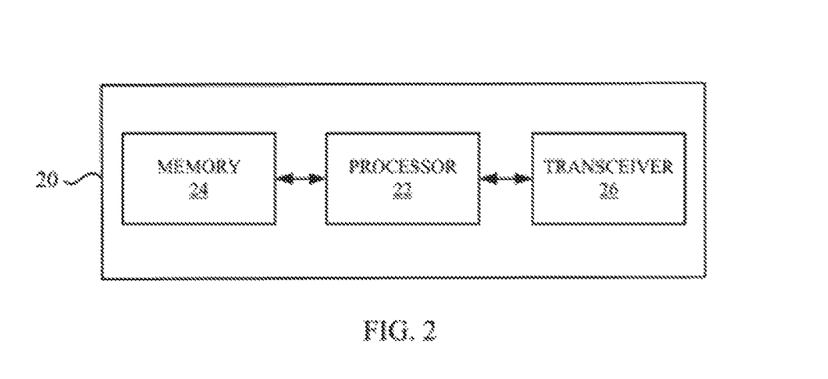
FIG. 2 is a block diagram of an example node in the distributed network architecture shown in FIG. 1.

FIG. 2 is a block diagram of an example of a node 20. As shown, node 20 includes a processor 22 operatively connected to a memory unit 24 and a transceiver 26. In some embodiments, processor 22 is a general purpose processor.

In some embodiments, processor 22 is a processor that is specifically programmed to contain instructions therein, readable by the processor, that allow the processor to send/receive information to/from memory unit 24 and transceiver 26, as well as to cause transceiver 26 to send/receive signals in accordance with embodiments discussed herein. Further, depending on the particular application of the node, e.g., a sensor, node 20 may include more components therein to allow the node to perform functions required by the specific application. In the context of the discussion herein a physical data-link may include a transceiver such as transceiver 26.

Figure 3:
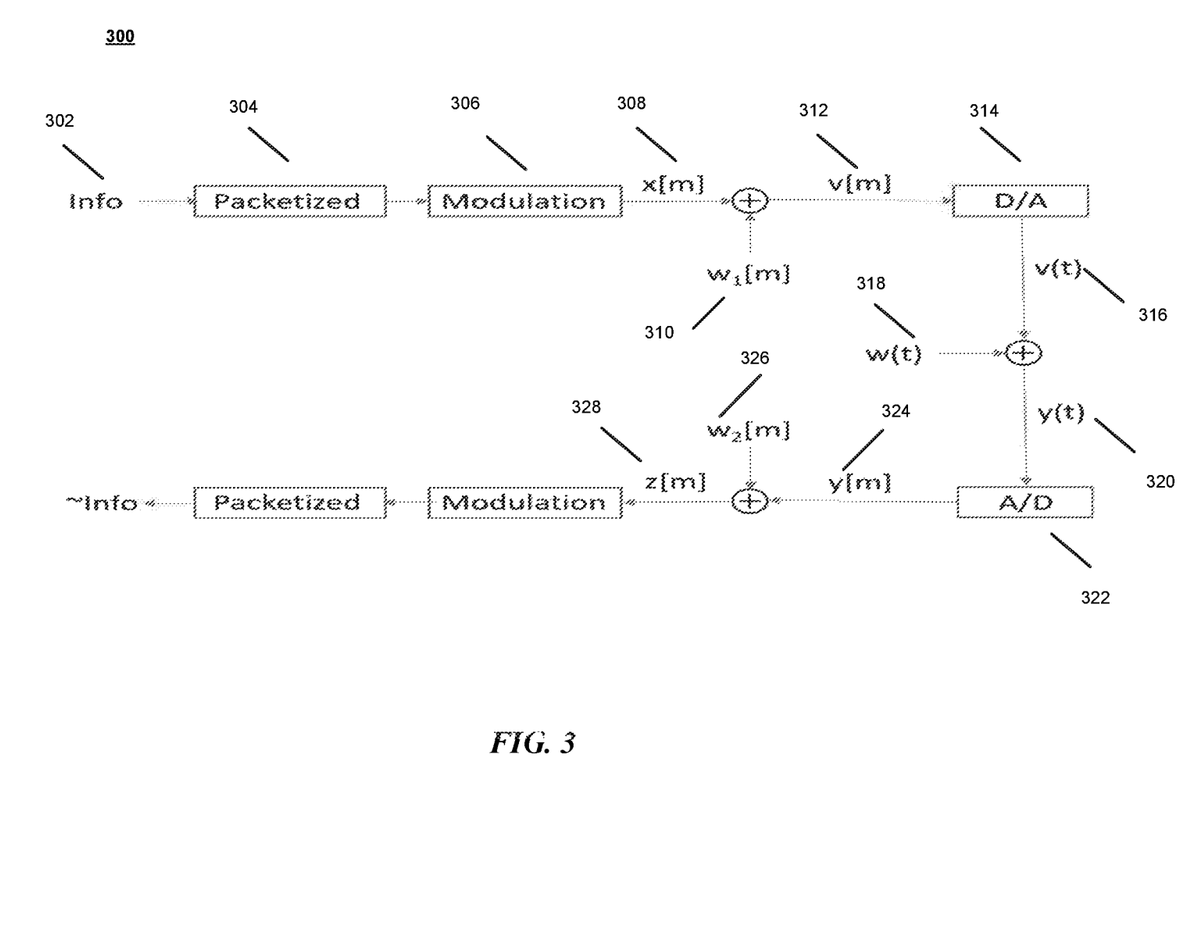
FIG. 3 illustrates an example infrastructure which may be used, according to example embodiments.

FIG. 3 illustrates an example infrastructure which may be used for example techniques discussed herein. As shown, FIG. 3 illustrates an example system 300 whereby information (302) is first packetized (304), modulated (306) and then a digital signal x[m] (308) is produced. This signal is transmitted through a logical data-channel where a process (310), labeled $w_1[m]$, introduces some Gaussian noise, which encapsulates the effects of multipath, Doppler, fading and movement. For this example setup, x[m] (308) represents a packet which is transmitted at time m (in seconds), and the process $w_1[m]$ (310) can cause a packet to be dropped with probability $p_1$. A signal v[m] (312) is defined as follows:

$$v[m] = \begin{cases} x[m], & w_1[m] = 0 \\ ?, & \text{otherwise} \end{cases}.$$

That is, v[m] (312) is either equal to x[m] (308) if $w_1[m]=0$. Otherwise if v[m]=1, it may be assumed that an erasure occurs since x[m] (308) represents an Internet Protocol (IP) packet which has a checksum enabling a determination of when a packet has been corrupted.

Next, v[m] (312) is sent through a digital to analog (D/A) converter (314) and a signal (316) is transmitted over analog where the signal (316) may experience statistical errors which are represented by a continuous Gaussian signal w(t) (318). For example, the D/A converter (314) may have the following form:

$$v(t) = \Sigma_m v[m]g(t-mT),$$

where T represents the time between samples and g represents a raised cosine function. Next, the signal (320) is converted (322) to a digital representation y[m] (324) by sampling the signal y(t) (320) at a rate greater than 1/T. Similar to before, it may be assumed that y[m] (324) represents a packet of information which is being transmitted over IP. Here, a Gaussian noise process $w_2[m]$ (326) can cause a packet to be dropped with probability $p_2$. Thus, a signal z[m] (328) may be defined in a manner analogous to v[m] (312):

$$z[m] = \begin{cases} y[m], & w_2[m] = 0 \\ ?, & \text{otherwise} \end{cases}.$$

Given $W=1/T$ and that $N_0/2$ represents the power spectral density for the noise w(t) (318), the maximum mutual information (or the capacity of the channel in bits) formed between v(t) (316) and y(t) (320) is $$I(v(t); y(t)) = \frac{w}{2}\log_2\left(1 + \frac{2P}{N_0 W}\right)$$

bits/second. It may be assumed that the noise process w(t) (318) is independent of $w_1[m]$ (310), $w_2[m]$ (326) and also that $w_1[m]$ (310), $w_2[m]$ (326) are independent. Furthermore, it may be assumed that the packets have average size B bytes at a particular time instant, and that $$B=I(v(t);y(t)).$$

If c packets are delivered at time m for the signals x[m] (308) and y[m] (324), there may exist an upper bound on the capacity, denoted as:

$$C \le \min\left(\frac{W}{2}\log_2\left(1 + \frac{2P}{N_0 W}\right), 8B(c - p_1 - p_2)\right) \quad (1)$$

bits per second. From Equation 1, a few observations regarding the design of the system can be made. In particular, since the capacity is given by the minimum of two expressions, it follows that increasing the bandwidth of the analog system will not improve the capacity unless c is large enough. Another observation that can be made is the performance of the system may be dependent on the choice of B (or the size of the packets). If $p_1+p_2$ is large, then the penalty (or the reduction in capacity) for the system may be greater for larger B. Thus, these parameters may be chosen depending on the characteristics of the underlying system.

Typically, the parameters W, P, and B may be fixed and may be a function of the hardware for the system. However, the parameters $N_0$, $p_1$, and $p_2$ depend on the behavior of the underlying system and may change over time. Example techniques discussed herein may model the parameters $N_0$, $p_1$, and $p_2$. This will be accomplished by inspecting the bit error rate (BER) curves of higher constellations such as 64-QAM (Quadrature Amplitude Modulation) and 256-QAM at various points in the diagram and assessing the quality of the receiver architecture. The physical data-link may begin with a pilot signal, which may be used for calibration and channel equalization. In addition, all the datagrams transmitted may be timestamped. One of the goals is to determine how close the transmission scheme can get to the theoretical bandwidth efficiency limits given different modulation schemes.

As discussed above, it has been assumed that the parameters $N_0$, $p_1$, and $p_2$ depend on the behavior of the underlying system and may change over time. In light of this, different courses of action may be determined given the dynamic nature of these parameters. In particular:

1. The use of machine learning techniques to infer changes in $N_0$, $p_1$, and $p_2$ over time.
2. Adaptive modulation techniques that improve information flow.
3. Example packet layer error-correction codes and synchronization algorithms that minimize decoding delays.
4. Optimizing the use of redundant information at the link layer along with redundant information at the packet layer.

Figure 4:
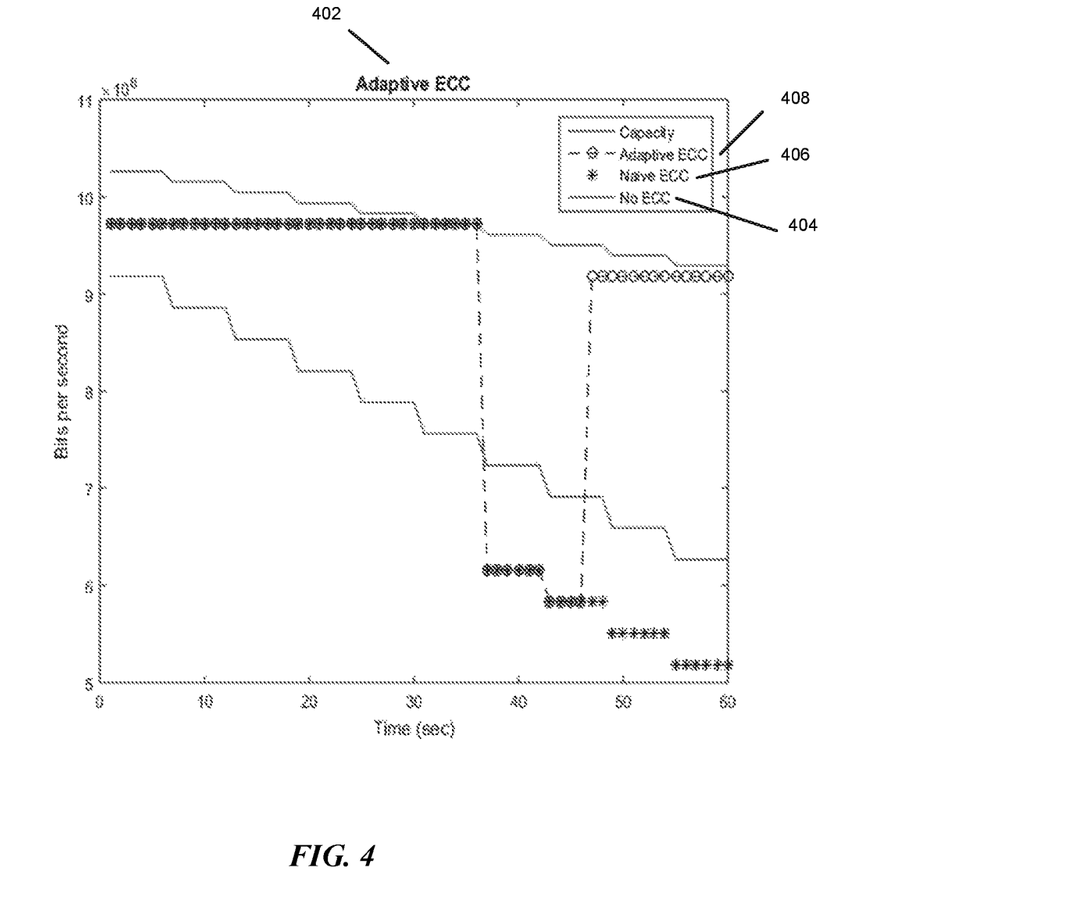
FIG. 4 illustrates a plot showing a result of using adaptive error correction codes.

Suppose that in Equation 1, $$8B(c - p_1 - p_2) \le \frac{W}{2}\log_2\left(1 + \frac{2P}{N_0 W}\right)$$

that $C \le 8B(c-p_1-p_2)$. Assume that the quantity $p_1+p_2$ is allowed to vary over time, and accordingly, the level of error correction is also allowed to change since the error correction code (ECC) is implemented at the packet layer. Under this scenario, a delay may be introduced each time the channel changes and during this time, packets may be dropped. As an illustration, let B=1500 so that the packets are 1500 bytes each where c=90,000, which is in theory the number of packets possible for a 1 GB (gigabyte) network card. Further, suppose $p_1+p_2$ varies over time. FIG. 4 illustrates a plot showing a benefit of using adaptive error correction code 402 (with a delay of 10 seconds used to adapt the ECC) in place of a single packet level Reed Solomon code designed to target the average value of $p_1+p_2$.

In FIG. 4, three different options for handling dropped packets are considered, as an experiment. In the first option 404, labeled "No ECC," no coding techniques were applied and the information rate degraded as a linear function of the packet loss rate where a re-transmit penalty lowered the effective information rate. Another option 406 is to implement ECC (labeled "Naïve ECC" in the plot of FIG. 4) at the packet layer to attempt to recover the dropped packets. In this case, the level of ECC may be set to be equal to the average packet drop rate over the entire course of the experiment. As can be seen in FIG. 4, this setup helped for the case where the packet loss rate was below that threshold, but after the packet loss rate exceeds the level of ECC (around 35 seconds), the coded scheme actually performed worse in terms of information rate than the uncoded scheme since the ECC is not helping and a rate penalty may be paid to implement ECC.

In accordance with example techniques discussed herein, an ECC 408 that adapts depending on the conditions of the channel may be used. Results of simulations showed that the adaptive ECC 408 performed similarly to the Naïve ECC 406 for the case where the packet loss rate was below the error recovery threshold. Then, after around forty-five (45) seconds, the adaptive ECC 408 learned that the channel had worsened and adjusted the ECC accordingly. In this case, the information rate returned to a substantially higher level than what was possible using no ECC 404 and using a Naïve ECC 406 scheme.

Next, a more realistic case may be considered, where the channel itself experiences periods of high SNR (which in this case translates to a low probability that a packet is dropped) and low SNR. It is known that under these circumstances the optimal solution may be to create a long-enough coding scheme which is able to correct all the errors. In this manner, the periods of high and low SNR basically average each other out and the resulting error correction coding scheme consequently may have a higher information rate. However, by using longer error correction codes, the delay in recovering the dropped packets may be substantially large. On the other hand, creating shorter codes may advantageously reduce the recovery delay at the expense of increasing unneeded packets of redundancy.

In light of this trade-off between minimizing the recovery delay and keeping the packets of redundancy low, error correction codes may be designed that introduce a small number of redundant packets and minimize the recovery delay. These codes may be used to fulfill different latency/data integrity requirements for end user applications given the dynamic nature of the communication channel. For example, full motion video may typically have stringent requirements on the latency, but may have looser data integrity needs. On the other hand, track data may have looser latency requirements, but more strict data integrity needs. By fine tuning the parameters of the application layer error control codes, the performance of the overall system can be improved.

Example techniques discussed herein may use example error correction codes that have been proposed in the context of distributed storage, applying new codes to packet layer error correction.

Consider the following synthetic scenario, which is somewhat similar to that discussed above. Suppose that in Equation 1, $$8B(c - p_1 - p_2) \leq \frac{W}{2}\log_2\left(1 + \frac{2P}{N_0 W}\right)$$

so that $C \leq 8B(c-p_1-p_2)$. Assume that the quantity $p_1+p_2$ is 0.30 for the first 10 seconds. Then, it decreases to 0.10 for the next 20 seconds and it is 0.10. Between time 30 and 40 seconds $p_1+p_2$ goes back up to 0.30 before again decreasing to 0.10 for the next 20 seconds. Suppose this pattern keeps repeating. As before, let B=1500 so that the packets are 1500 bytes each and suppose c=20.

Three types of codes are considered for this example. The first code is a Reed-Solomon code (RS1) with rate 0.70 and length 200. The second code is a Reed-Solomon code (RS2) with rate 0.83 and length 600. The third code is a PMDS code with rate 0.83 and length 600. Table 1 shown below illustrates the properties of each of the codes.

TABLE 1

Trade-off Between Recovery Delay and Information Rate

| Code | Average Recovery Delay | Rate |
|---|---|---|
| RS1 | 10 seconds | 0.70 |
| RS2 | 30 seconds | 0.83 |
| PMDS | 16.67 seconds | 0.83 |

These PMDS codes may be used to more accurately match the data integrity/time latency requirements of each application on the system. Example techniques discussed herein may employ a cross-layer method of implementing coding at both the data layer as well as the application layer. In particular, example techniques herein may manage the introduction of redundant communications (such as parity bits) in a cross-layer approach.

Various storage media, such as magnetic computer disks, optical disks, and electronic memories, as well as non-transitory computer-readable storage media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

Features discussed herein are provided as example techniques that may be implemented in many different ways that may be understood by one of skill in the art of computing, without departing from the discussion herein. Such features are to be construed only as example features, and are not intended to be construed as limiting to only those detailed descriptions.

Figure 5:
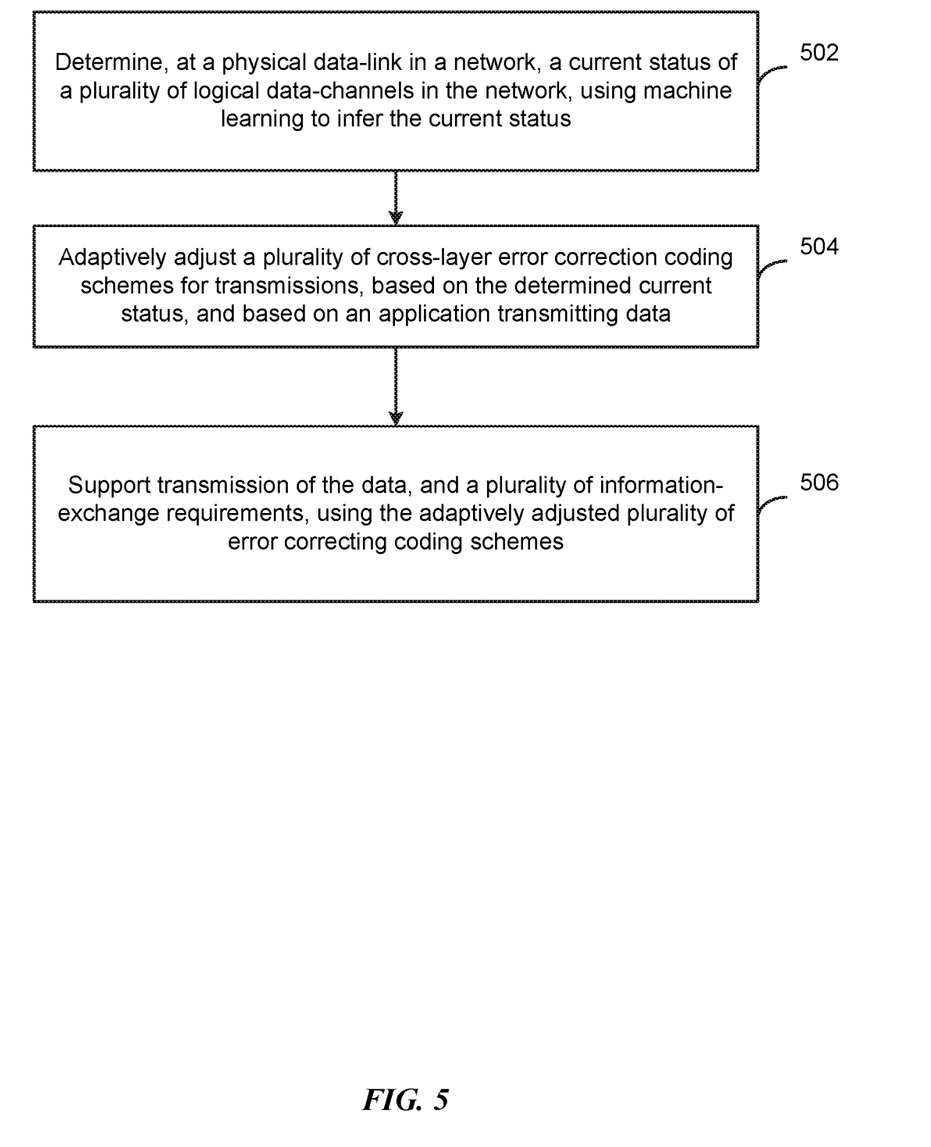
FIG. 5 is a flowchart illustrating example operations of the system of FIG. 2, according to example embodiments.

FIG. 5 is a flowchart illustrating example operations of the system of FIG. 2, according to example embodiments. As shown in the example of FIG. 5, at a physical data-link in a network, a current status of a plurality of logical data-channels in the network is determined, using machine learning to infer the current status (502). A plurality of cross-layer error correction coding schemes for transmissions is adaptively adjusted, based on the determined current status, and based on an application transmitting data (504). Transmission of the data, and a plurality of information-exchange requirements, is supported, using the adaptively adjusted plurality of error correction coding schemes (506).

For example, the physical data-link may include a transceiver. For example, the physical data-link may include a transmitter.

For example, determining the current status may include determining the current status of a plurality of logical data-channels in the network using one or more self-adaptive methods/techniques, which may include machine learning, autonomic computing, or artificial intelligence.

For example, adaptively adjusting the plurality of cross-layer error correction coding schemes for transmissions may include adaptively adjusting a plurality of maximum distance separable (MDS) coding schemes for transmissions.

For example, the physical data-link may include an autonomic device.

For example, the physical data-link may use a plurality of probes to determine the current status. For example, the plurality of probes may include one or more of physically-distributed probes, or logically-distributed probes. For example, the physically-distributed probes may include one or more radio frequency (RF) transducers. For example, the logically-distributed probes may include one or more packet-layer probes.

For example, the physical data-link may determine the current status based on determining a measure of a power level or a measure of a level of network interference.

For example, determining the current status of the network may include determining a channel impairment in the network.

For example, determining the current status of the network may include determining an improvement in a condition of the network following a channel impairment in the network.

Features discussed herein are provided as example techniques that may be implemented in many different ways that may be understood by one of skill in the art of computing, without departing from the discussion herein. Such features are to be construed only as example features, and are not intended to be construed as limiting to only those detailed descriptions.

For example, the one or more processors (e.g., hardware device processors) may be included in at least one processing apparatus. One skilled in the art of computing will understand that there are many configurations of processors and processing apparatuses that may be configured in accordance with the discussion herein, without departing from such discussion.

In this context, a "component" or "module" may refer to instructions or hardware that may be configured to perform certain operations. Such instructions may be included within component groups of instructions, or may be distributed over more than one group. For example, some instructions associated with operations of a first component may be included in a group of instructions associated with operations of a second component (or more components). For example, a "component" herein may refer to a type of functionality that may be implemented by instructions that may be located in a single entity, or may be spread or distributed over multiple entities, and may overlap with instructions and/or hardware associated with other components.

In this context, a "memory" may include a single memory device or multiple memory devices configured to store data and/or instructions. Further, the memory may span multiple distributed storage devices. Further, the memory may be distributed among a plurality of processors.

One skilled in the art of computing will understand that there may be many ways of accomplishing the features discussed herein.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method of adapted cross-layer error control in a network having a physical, packet, and application layer, the method comprising:
    inferring, via machine learning at a physical data-link in the network, a current status of a plurality of logical data-channels in the network, the current status including a respective dynamic condition for each logical data-channel of the logical data-channels, the respective dynamic condition including a noise level at the physical layer of the logical data-channel and a channel impairment at the packet layer through the logical data-channel;
    adaptively adjusting a plurality of cross-layer error correction coding schemes for the logical data-channels, including adaptively selecting a respective parameterized one of the cross-layer error correction coding schemes for each logical data-channel of the logical data-channels based on the noise level and the channel impairment of the respective dynamic condition for the logical data-channel within the current status inferred via the machine learning, and based on an information-exchange requirement at the application layer of an application transmitting data through the logical data-channel; and
    supporting transmission of the data through each of the logical data-channels, using the adaptively adjusted plurality of cross-layer error correction coding schemes,
    wherein the adaptively adjusting the plurality of cross-layer error correction coding schemes includes adaptively selecting a forward error correcting code for each logical data-channel of the logical data-channels from a set of available forward error correcting codes and adaptively selecting at least one parameter including a code length for the forward error correcting code, the forward error correcting code and the at least one parameter adaptively selected based on the noise level at the physical layer, the channel impairment at the packet layer, and the information-exchange requirement at the application layer for the logical data-channel.

2. The method of claim 1, wherein the adaptively adjusting the plurality of cross-layer error correction coding schemes includes adaptively selecting the respective parameterized one for each logical data-channel including adaptively selecting the forward error correcting code for the logical data-channel from the set including a Reed-Solomon code and a maximum distance separable (MDS) code and adaptively selecting the at least one parameter including the code length for the forward error correcting code adaptively selected for the logical data-channel, the forward error correcting code and the at least one parameter adaptively selected based on the noise level at the physical layer, the channel impairment at the packet layer, and the information-exchange requirement at the application layer for the logical data-channel.

3. The method of claim 1, wherein the inferring of the current status via the machine learning includes:
    using physically-distributed probes to measure a bit error rate at the physical layer for each of the logical data-channels, and
    from the bit error rate at the physical layer, inferring with the machine learning the noise level at the physical layer and the channel impairment at the packet layer of the respective dynamic condition for each of the logical data-channels.

4. The method of claim 1, wherein the inferring of the current status via the machine learning includes the machine learning inferring the noise level of the respective dynamic condition for each logical data-channel that is a measure of a power spectral density of the logical data-channel at the physical layer.

5. The method of claim 1, wherein the inferring of the current status via the machine learning includes the machine learning inferring the channel impairment of the respective dynamic condition for each logical data-channel that is a probability of packet loss through the logical data-channel at the packet layer.

6. The method of claim 1, wherein the adaptively selecting the forward error correcting code and the at least one parameter including the code length for each logical data-channel of the logical data-channels includes:
    for each of the available forward error correcting codes in the set at each of a plurality of available code lengths, dynamically evaluating a recovery delay at the noise level and the channel impairment of the respective dynamic condition for the logical data-channel;
    adaptively selecting the forward error correcting code for the logical data-channel from the available forward error correcting codes at the code length from the available code lengths, the forward error correcting code and the code length selected that has the recovery delay fulfilling a time latency requirement of the information-exchange requirement of the application transmitting the data through the logical data-channel.

7. The method of claim 6, wherein the inferring of the current status via the machine learning includes:
    measuring a bit error rate at the physical layer for each logical data-channel of the logical data-channels, and
    from the bit error rate at the physical layer for each logical data-channel of the logical data-channels, inferring with the machine learning the noise level and the channel impairment of the respective dynamic condition for the logical data-channel, wherein the noise level includes a power spectral density of the logical data-channel at the physical layer and the channel impairment includes a probability of packet loss through the logical data-channel at the packet layer.

8. The method of claim 1, wherein the inferring of the current status via the machine learning includes:
measuring a bit error rate at the physical layer for each logical data-channel of the logical data-channels, and
from the bit error rate at the physical layer for each logical data-channel of the logical data-channels, inferring with the machine learning the noise level and the channel impairment of the respective dynamic condition for the logical data-channel.

9. The method of claim 8, wherein, for each logical data-channel of the logical data-channels, the noise level includes a power spectral density of the logical data channel at the physical layer, the channel impairment includes a probability of packet loss through the logical data-channel at the packet layer, and the information-exchange requirement of the application transmitting the data through the logical data-channel includes a time latency requirement.

10. A system for adaptive cross-layer error control in a network having a physical, packet, and application layer, the system comprising:
a transmitter in the network, the transmitter including:
at least one hardware device processor; and
a non-transitory computer-readable storage medium storing instructions that are executable by the at least one hardware device processor to:
infer, via machine learning, a current status of a plurality of channels in the network, the current status including a respective dynamic condition for each channel of the channels, the respective dynamic condition including a noise level at the physical layer of the channel and a channel impairment at the packet layer through the channel;
adaptively adjust a plurality of cross-layer error correction coding schemes for the channels, including adaptively selecting a respective parameterized one of the cross-layer error correction coding schemes for each channel of the channels based on the noise level and the channel impairment of the respective dynamic condition for the channel within the current status inferred via the machine learning, and based on an information-exchange requirement at the application layer of an application transmitting data through the channel; and
initiate transmission of the data through each of the channels, using the adaptively adjusted plurality of cross-layer error correction coding schemes,
wherein the adaptively adjust the plurality of cross-layer error correction coding schemes includes adaptively select a forward error correcting code for each channel of the channels from a set of available forward error correcting codes and adaptively select at least one parameter including a code length for the forward error correcting code, the forward error correcting code and the at least one parameter adaptively selected based on the noise level at the physical layer, the channel impairment at the packet layer, and the information-exchange requirement at the application layer for the channel.

11. The method of claim 10, wherein the adaptively select the forward error correcting code and the at least one parameter including the code length for each channel of the channels includes:
for each of the available forward error correcting codes in the set at each of a plurality of available code lengths, dynamically evaluate a recovery delay at the noise level and the channel impairment of the respective dynamic condition for the channel;
adaptively select the forward error correcting code for the channel from the available forward error correcting codes at the code length from the available code lengths, the forward error correcting code and the code length selected that has the recovery delay fulfilling a time latency requirement of the information-exchange requirement of the application transmitting the data through the channel.

12. The method of claim 11, wherein the infer the current status via the machine learning includes:
measure a bit error rate at the physical layer for each channel of the channels, and
from the bit error rate at the physical layer for each channel of the channels, infer with the machine learning the noise level and the channel impairment of the respective dynamic condition for the channel, wherein the noise level includes a power spectral density of the channel at the physical layer and the channel impairment includes a probability of packet loss through the channel at the packet layer.

13. The method of claim 10, wherein the infer the current status via the machine learning includes:
measure a bit error rate at the physical layer for each channel of the channels, and
from the bit error rate at the physical layer for each channel of the channels, infer with the machine learning the noise level and the channel impairment of the respective dynamic condition for the channel,
wherein, for each channel of the channels, the noise level includes a power spectral density of the channel at the physical layer, the channel impairment includes a probability of packet loss through the channel at the packet layer, and the information-exchange requirement of the application transmitting the data through the channel includes a time latency requirement.

14. A non-transitory computer-readable storage medium storing instructions for adapted cross-layer error control in a network having a physical, packet, and application layer, the instructions executable by at least one hardware device processor to:
infer, via machine learning at a physical data-link in the network, a current status of a plurality of channels in the network, the current status including a respective dynamic condition for each channel of the channels, the respective dynamic condition including a noise level at the physical layer of the channel and a channel impairment at the packet layer through the channel;
adaptively adjust a plurality of cross-layer error correction coding schemes for the channels, including adaptively selecting a respective parameterized one of the cross-layer error correction coding schemes for each channel of the channels based on the noise level and the channel impairment of the respective dynamic condition for the channel within the current status inferred via the machine learning, and based on an information-exchange requirement at the application layer of an application transmitting data through the channel; and
initiate transmission of the data through each of the channels, using the adaptively adjusted plurality of cross-layer error correction coding schemes,
wherein the adaptively adjust the plurality of cross-layer error correction coding schemes includes adaptively select a forward error correcting code for each channel of the channels from a set of available forward error correcting codes and adaptively select at least one parameter including a code length for the forward error correcting code, the forward error correcting code and the at least one parameter adaptively selected based on the noise level at the physical layer, the channel impairment at the packet layer, and the information-exchange requirement at the application layer for the channel.

15. The method of claim 14, wherein the adaptively select the forward error correcting code and the at least one parameter including the code length for each channel of the channels includes:
for each of the available forward error correcting codes in the set at each of a plurality of available code lengths, dynamically evaluate a recovery delay at the noise level and the channel impairment of the respective dynamic condition for the channel;
adaptively select the forward error correcting code for the channel from the available forward error correcting codes at the code length from the available code lengths, the forward error correcting code and the code length selected that has the recovery delay fulfilling a time latency requirement of the information-exchange requirement of the application transmitting the data through the channel.

16. The method of claim 15, wherein the infer the current status via the machine learning includes:
measure a bit error rate at the physical layer for each channel of the channels, and
from the bit error rate at the physical layer for each channel of the channels, infer with the machine learning the noise level and the channel impairment of the respective dynamic condition for the channel, wherein the noise level includes a power spectral density of the channel at the physical layer and the channel impairment includes a probability of packet loss through the channel at the packet layer.

17. The method of claim 14, wherein the infer the current status via the machine learning includes:
measure a bit error rate at the physical layer for each channel of the channels, and
from the bit error rate at the physical layer for each channel of the channels, infer with the machine learning the noise level and the channel impairment of the respective dynamic condition for the channel,
wherein, for each channel of the channels, the noise level includes a power spectral density of the channel at the physical layer, the channel impairment includes a probability of packet loss through the channel at the packet layer, and the information-exchange requirement of the application transmitting the data through the channel includes a time latency requirement.

* * * * *